United States Patent
Yu et al.

(10) Patent No.: US 7,783,940 B2
(45) Date of Patent: Aug. 24, 2010

(54) APPARATUS FOR REDUNDANCY RECONFIGURATION OF FACULTY MEMORIES

(75) Inventors: Lizhen Yu, Shanghai (CN); Shianling Wu, Princeton, NJ (US); Zhigang Jiang, Burlingame, CA (US); Laung-Terng Wang, Sunnyvale, CA (US)

(73) Assignee: Syntest Technologies, Inc., Sunnyvale, CA (US)

(*) Notice: Subject to any disclaimer, the term of this patent is extended or adjusted under 35 U.S.C. 154(b) by 315 days.

(21) Appl. No.: 12/155,596

(22) Filed: Jun. 6, 2008

(65) Prior Publication Data

US 2009/0303815 A1    Dec. 10, 2009

(51) Int. Cl.
G11C 29/00    (2006.01)

(52) U.S. Cl. .................. 714/710; 714/2; 714/3; 714/5; 714/6; 714/7; 714/8; 714/42; 714/711; 714/718; 714/723; 365/200; 365/201

(58) Field of Classification Search ........................ None
See application file for complete search history.

(56) References Cited

U.S. PATENT DOCUMENTS

| | | | | |
|---|---|---|---|---|
| 5,295,101 A | * | 3/1994 | Stephens et al. | 365/200 |
| 5,469,390 A | * | 11/1995 | Sasaki et al. | 365/200 |
| 5,633,826 A | * | 5/1997 | Tsukada | 365/200 |
| 5,914,907 A | * | 6/1999 | Kobayashi et al. | 365/230.03 |
| 6,320,800 B1 | * | 11/2001 | Saito et al. | 365/189.19 |
| 6,946,985 B2 | * | 9/2005 | Nicolaidis | 341/141 |
| 7,073,102 B2 | * | 7/2006 | Nicolaidis | 714/718 |
| 7,263,011 B2 | * | 8/2007 | Gouin et al. | 365/200 |
| 2005/0223269 A1 | * | 10/2005 | Stolowitz | 714/6 |
| 2005/0232035 A1 | * | 10/2005 | Miyakawa et al. | 365/200 |

OTHER PUBLICATIONS

U.S. Appl. No. 10/468,265, filed Sep. 20, 2005, M. Nicolaidis et al.
U.S. Appl. No. 10/286,686, filed Jul. 4, 2006, M. Nicolaidis et al.
* cited by examiner

*Primary Examiner*—John P Trimmings
(74) *Attorney, Agent, or Firm*—Bacon & Thomas, PLLC

(57) ABSTRACT

A memory redundancy reconfiguration for N base blocks associated with k redundant blocks. The data will be written into both base blocks and defect-free redundant blocks if the base blocks are defective; k multiplexers $MUX_{Ri}$ each having N input signals ($d_0$ to $d_{N-1}$) capable of being connected to k input signals of the redundant blocks; N multiplexers $MUX_i$ each having k+1 input signals from k redundant blocks ($R_0$ to $R_{k-1}$) and one base block ($N_i$), capable of being connected to N output signals ($q_i$); and logic means associated with each multiplexer, to convert the input signals of the multiplexer to its output signal.

5 Claims, 6 Drawing Sheets

US 7,783,940 B2

APPARATUS FOR REDUNDANCY RECONFIGURATION OF FACULTY MEMORIES

FIELD OF THE INVENTION

The present invention generally relates to the field of memory testing and repair. Specifically, the present invention relates to the field of memory Built-in Self-Repair (BISR).

BACKGROUND

With VLSI designs entering multi-million gate count range, the yield of embedded memories is becoming a limiting factor for the overall yield for Integrated Circuit manufacturing. Memory built-in self-repair (BISR) techniques can help improve the yield of embedded memories. The memory BISR capability allows an IC device to continue to function despite the presence of defect(s) in its embedded memories. With memory BISR, faulty or defective memory blocks are identified and replaced with "redundant" memory block(s). These redundant memory blocks are pre-allocated memory blocks within a chip to be used for BISR purposes. By contrast, regular memory blocks are called "base" blocks.

Two methods for memory BISR have been proposed previously by Nicolaidis, et al. (2003). In the first method, as illustrated in FIG. 1, a memory block once identified as faulty is replaced by its closest fault-free block. This fault-free block, used for repair, can either be a base block or a redundant block. In another method, as illustrated in FIG. 2, a memory block identified as faulty can only be replaced by a designated redundant block. Both methods require using multiplexers (MUXes) to perform memory read/write operations for input data pins. The presence of the MUXes will slow down the operating speed of the memory.

SUMMARY OF THE INVENTION

The present invention provides a novel solution to memory BISR. During memory BISR, for a fault-free base block, input data can be written directly into the base block without going through a network of multiplexers (MUXes). This will allow the memory to operate at its intended speed during the write mode of operation.

THE BRIEF DESCRIPTION OF DRAWINGS

The above and other objectives, advantages and features of the invention will become more apparent when considered with the following specifications and accompanying drawings wherein.

DETAILED DESCRIPTION OF THE INVENTION

The following description is presently contemplated as the best mode of carrying out the present invention. This description is not to be taken in a limiting sense but is made merely for the purpose of describing the principles of the invention. The scope of the invention should be determined by referring to the appended claims.

Figure 1:
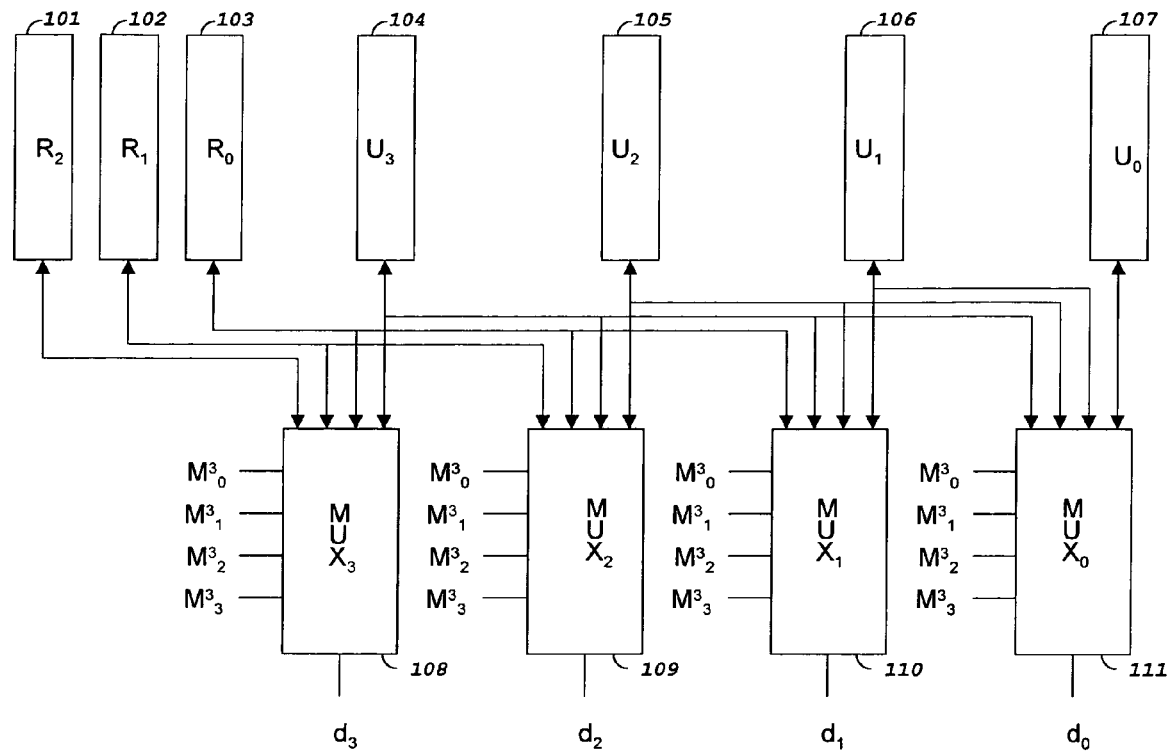
FIG. 1 and FIG. 2 show two prior art BISR reconfiguration schemes.

FIG. 1 shows a prior art memory built-in self-repair (BISR) configuration that includes redundant blocks $R_2$-$R_0$ 101-103, base blocks $U_3$-$U_0$ 104-107 and multiplexers $MUX_3$-$MUX_0$ 108-111. In this configuration, base blocks $U_3$-$U_0$ 104-107 are default blocks to be used for standard memory access operations of a chip. If a block, say $U_2$ 105, is found to be faulty, it can be replaced by a redundant block $R_0$ 103, $R_1$ 102, or an "available" base block, $U_3$ 104. In this case, both base blocks and redundant blocks can be used for memory self-repair purposes.

Figure 2:
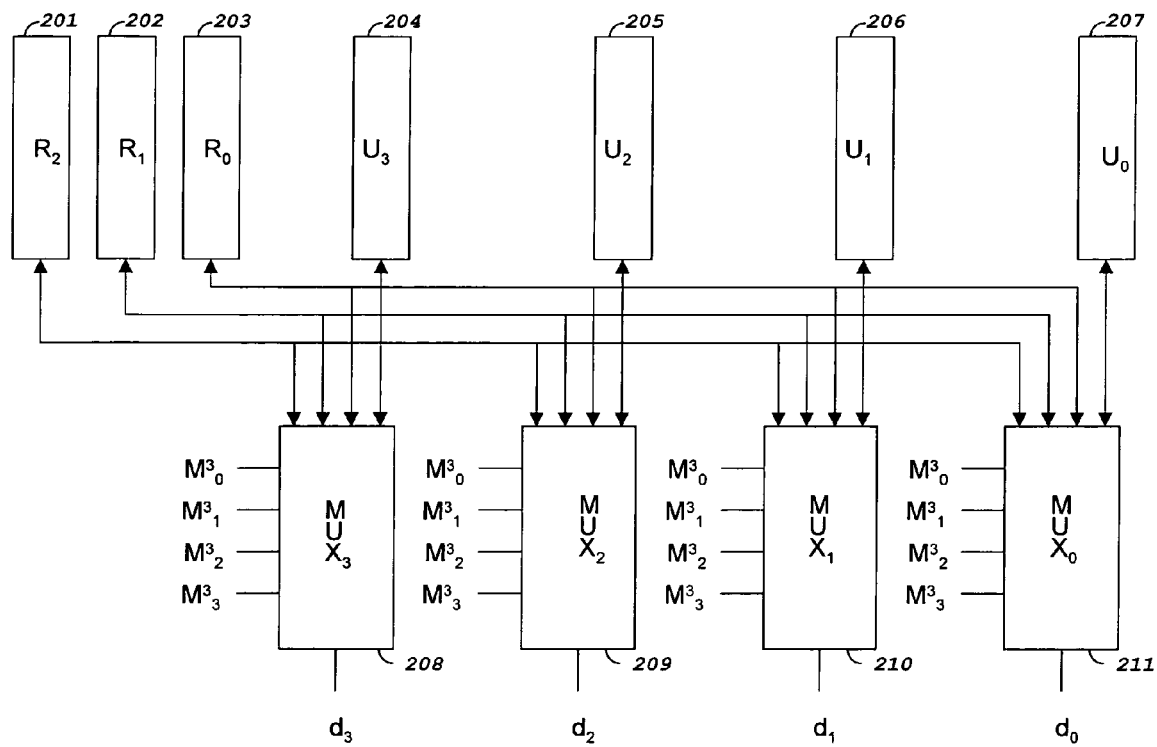

FIG. 2 shows a prior art memory BISR configuration that includes redundant blocks $R_2$-$R_0$ 201-203, base blocks $U_3$-$U_0$ 204-207 and multiplexers $MUX_3$-$MUX_0$ 208-211. In this configuration, base blocks $U_3$-$U_0$ 204-207 are default blocks to be used for standard memory access operations of a chip. If a block, say $U_2$ 205, is found to be faulty, it can be replaced by a redundant block $R_0$ 203, $R_1$, 202 or $R_2$ 201. In this case, only redundant blocks can be used for memory self-repair purposes.

The embodiment of the present invention, further illustrated in FIG. 3 to FIG. 8, provides the method for a reconfiguration that supports the self-repair operations for the memory with redundant blocks or units. For different function of memory such as read and write, configurations are different in this present invention.

For ease of illustration, we make definitions as follows: A base block of the memory will be called $U_i$, with i ranging from 0 to N−1. The redundant blocks will be called $R_0$ to $R_{k-1}$, where k is the number of pre-allocated redundant blocks within a chip. The multiplexers associated with redundant blocks $R_0$ to $R_{k-1}$ will be called $MUX_{R0}$ to $MUX_{Rk-1}$. The multiplexers associated with base block $U_0$ to $U_{N-1}$ will be called $MUX_0$ to $MUX_{N-1}$. $d_i$ designates the input signal of the memory unit ($0 \leq i \leq N-1$). $q_i$ designates the output signal of the memory unit ($0 \leq i \leq N-1$). The control signals for $MUX_{Ri}$ ($0 \leq i \leq K-1$) are $M^i_j$ ($0 \leq j \leq N-1$). The control signals for $MUX_i$ ($0 \leq i \leq N-1$) are $M^i_j$ ($0 \leq j \leq K-1$).

Figure 3:
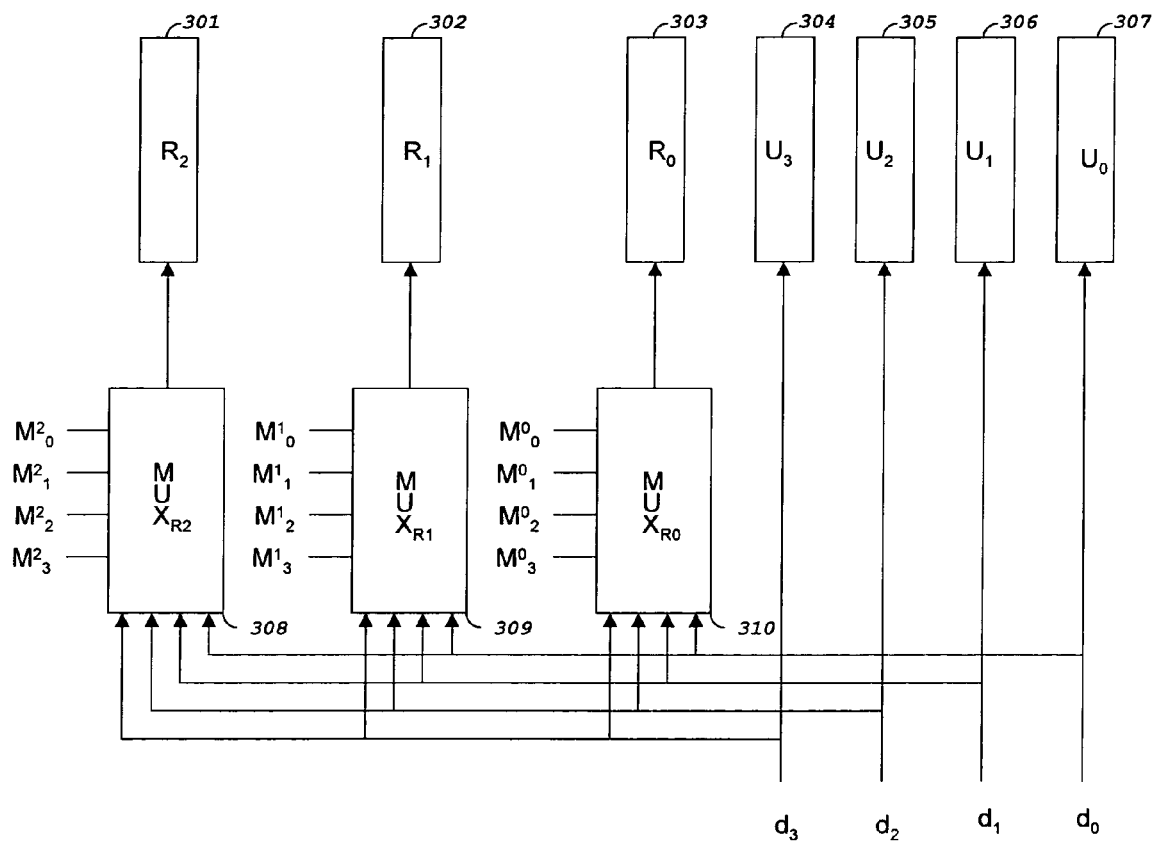
FIG. 3 shows an embedded memory in its write configuration, in accordance with the present invention, where the redundant block is used to write the data if the base block is defective.
Figure 5:
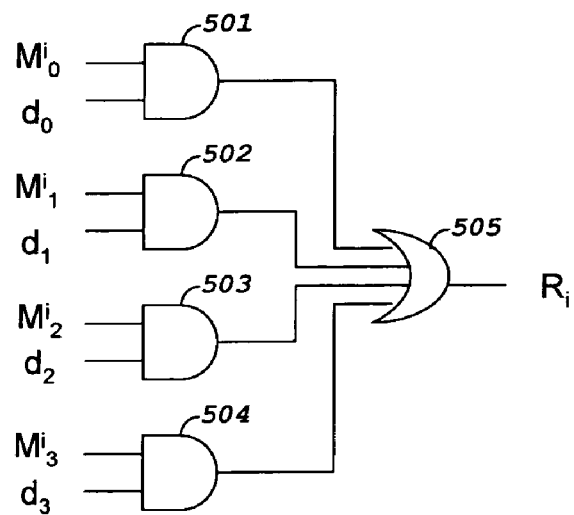
FIG. 5 shows a first embodiment of a multiplexer (MUX) shown in FIG. 3, in accordance with the present invention.
Figure 7:
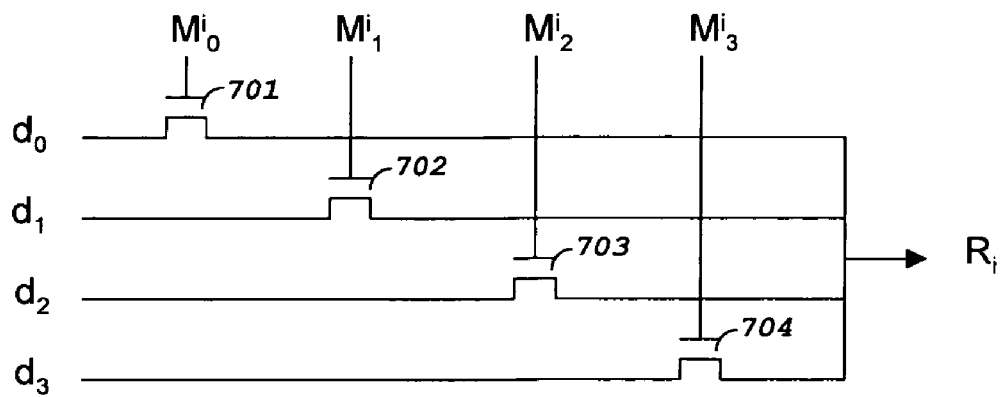
FIG. 7 shows a second embodiment of a multiplexer (MUX) shown in FIG. 3, in accordance with the present invention.

FIG. 3 is an example for the write type configuration where the data may propagate from input signals $d_3$ to $d_0$ to base units $U_3$ to $U_0$ 304-307 and redundant units $R_2$ to $R_0$ 301-303 through the multiplexers $MUX_{R2}$ to $MUX_{R0}$ 308-310. The multiplexer design for write configuration is shown in FIG. 5 and FIG. 7. When $M^i_1$ is equal to 1, then only $d_1$ will be written to the redundant block $R_i$.

For write configuration, the input signal, $d_i$, of the memory unit fans out to $U_i$ and $MUX_{R0}$ to $MUX_{Rk-1}$. Each multiplexer $MUX_{Ri}$ has N control signals $M^i_0$ to $M^i_{N-1}$. When one of the MUX control signals is 1, this means a base memory block is defective and a redundant block is needed for the repair operation. When all control signals are 0, there is no need for a repair operation. For example, if block $U_0$ is defect-free, while $U_1$ is defective, $M^0_1$ must be 1 and all the multiplexer's other control inputs, $M^0_0$, $M^0_2$ to $M^0_{N-1}$, must be zero. The input, $d_1$, will be stored in redundant block $R_0$.

For ease of illustration, we make the following definitions: $r_i$ represents the state of a redundant block and $\overline{r_i}$ its complementary state. $r_i$ will be zero if the redundant block i is defect-free, else the redundant block i is defective. $u_i$ represents the state of a base block and $\overline{u_i}$, its complementary state. $u_i$ will be zero if the base block, $U_i$, is defect-free, else the base block, $U_i$, is defective.

The logic values at the multiplexer control inputs $M^{i+1}_{j+1}$, where $0 \leq i \leq k-2$ and $0 \leq j \leq N-2$, can be expressed in terms of the states of their associated base blocks $U_0$ to $U_k$ as follows:

$$M^{i+1}_{j+1} = \overline{r_{i+1}} u_{j+1} \left[ \begin{array}{c} \sum_{n=0}^{j} M^i_n + r_i \sum_{n=0}^{j} M^{i-1}_n + \ldots + r_i r_{i-1} \ldots r_1 \\ \sum_{n=0}^{j} M^0_n + r_i r_{i-1} \ldots r_0 \overline{u_j u_{j-1}} \ldots \overline{u_0} \end{array} \right],$$

$$(0 \leq i \leq k-2; 0 \leq j \leq N-2)$$

As can be seen, variable $M^{i+1}_{j+1}$ is equal to 1 if base block, $U_{j+1}$, is defective, the redundant, $R_{i+1}$, is defect-free, and if there exists an integer n<i+1 such that the defect-free redundant block, $R_n$, is already assigned to a base unit $U_m$ with m<j+1, and the redundant blocks $R_{n+1}, R_{n+2}, \ldots, R_i$ are defective.

The logic values at the multiplexer control inputs $M^0_j$, where $0 \leq j \leq k$, can be expressed in terms of the states of their associated base blocks $U_0$ to $U_k$ as follows:

$$M^0_0 = \overline{r_0} u_0$$
$$M^0_1 = \overline{r_0} u_0 \overline{u_1}$$
$$M^0_2 = \overline{r_0} u_2 \overline{u_1 u_0}$$
$$M^0_3 = \overline{r_0} u_3 \overline{u_2 u_1 u_0}$$
$$\vdots$$
$$M^0_{N-1} = \overline{r_0} u_{N-1} \ldots \overline{u_2 u_1 u_0}$$

As can be seen, variable $M^0_0$ is equal to 1 if base block $U_0$ is defective and the redundant block, $R_0$ is defect-free, otherwise $M^0_0$ will be zero. Variable $M^0_{i+1}$ ($0 \leq i \leq N-2$) is equal to 1 when base block $U_{i+1}$ is defective, the base blocks, $U_n$ (integer n<i+1) are defect-free and the redundant block $R_0$ is defect-free, otherwise variable $M^0_{i+1}$ will be zero.

The logic values at the multiplexer control inputs $M^i_0$, where $0 \leq i \leq k$, can be expressed in terms of the states of their associated base blocks $U_0$ to $U_k$ as follows:

$$M^0_0 = \overline{r_0} u_0$$
$$M^1_0 = \overline{r_1}(r_0 u_0)$$
$$M^2_0 = \overline{r_2}(r_1 r_0 u_0)$$
$$\vdots$$
$$M^{k-1}_0 = \overline{r_{k-1}}(r_{k-2} r_{k-3} \ldots r_1 r_0 u_0)$$

As can be seen, variable $M^{i+1}_0$ ($0 \leq i \leq k-2$) is equal to 1 when base block $U_0$ is defective, the redundant block, $R_{i+1}$, is defect-free and $R_n$ (integer n<i+1) are defective, else variable $M^{i+1}_0$ will be zero.

Figure 4:
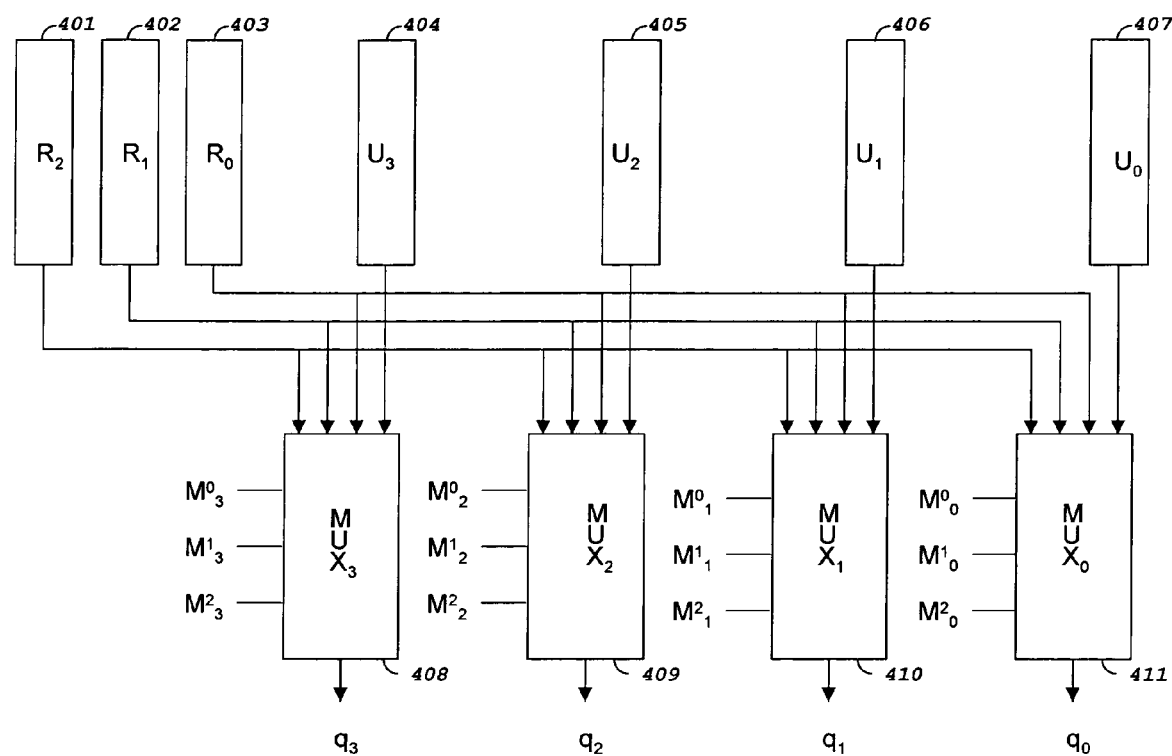
FIG. 4 shows an embedded memory in its read configuration, in accordance with the present invention, where the redundant block is used to read out if the base block is either defective or defect-free.
Figure 6:
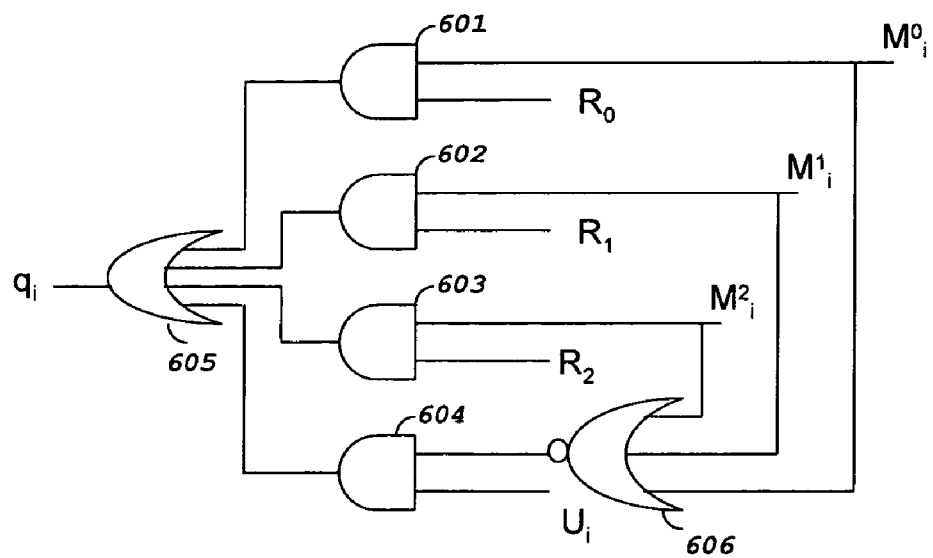
FIG. 6 shows a first embodiment of a multiplexer (MUX) shown in FIG. 4, in accordance with the present invention.
Figure 8:
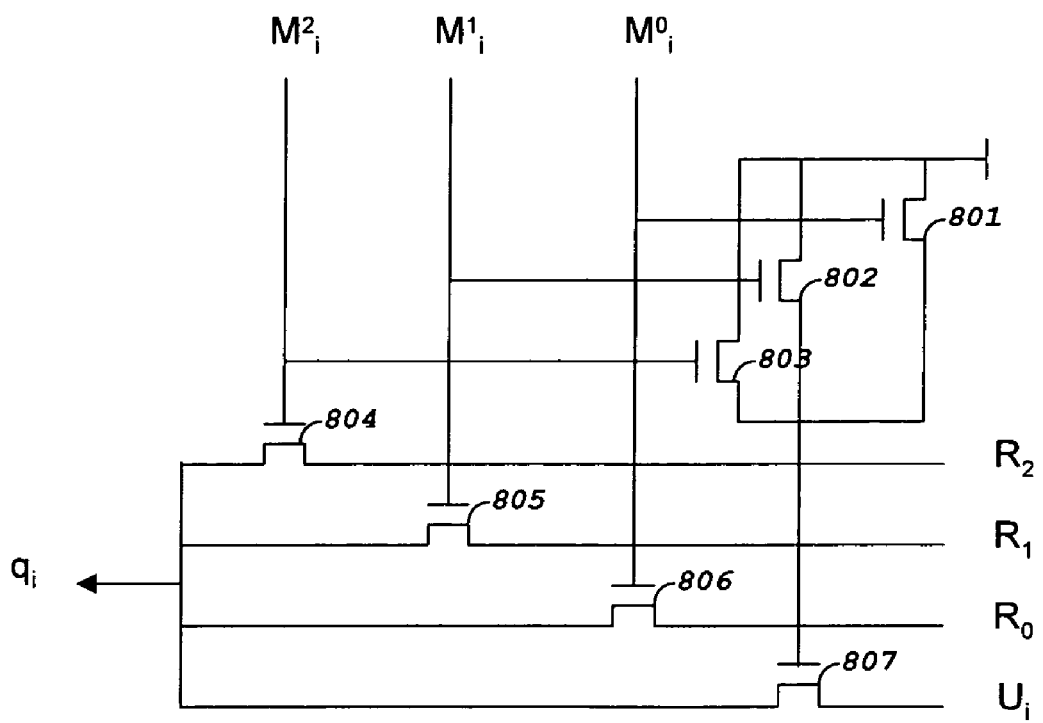
FIG. 8 shows a second embodiment of a multiplexer (MUX) shown in FIG. 4, in accordance with the present invention.

FIG. 4 is an example for the read type configuration where the data may propagate from base units, $U_3$ to $U_0$ 404-407, and redundant units, $R_2$ to $R_0$ 401-403, to output signals, $q_3$ to $q_0$ via the multiplexers $MUX_3$ to $MUX_0$ 408-410. The multiplexer design for read configuration is shown in FIG. 6 and FIG. 8. When $M^1_i$ is equal to 1, then the value in redundant block $R_1$ will be output to signal $q_i$.

For read configuration, the output signal, $q_i$, of the memory unit comes from $MUX_i$. Each multiplexer $MUX_i$ has K control signals $M^0_i$ to $M^{K-1}_i$. When one of the MUX control signals is 1, this means the base memory block i is defective and the value in the redundant block should be the output. When all control signals are 0, the base memory block i is defect-free and the value of it should be the output. For example, if $M^0_1$ is 1, the value of redundant block $R_0$ should be output to $q_1$. The variable $M^{i+1}_{j+1}$ is equal to those in the write configuration.

FIG. 5 and FIG. 7 show two different ways of implementations of the multiplexer used for write configuration in FIG. 3. For both implementations, the signal at $d_j$ will be propagated to the redundant block $R_i$, when $M^i_0, M^i_1, \ldots, M^i_{j-1}, M^i_j, M^i_{j+1} \ldots, M^i_{N-1} = 00 \ldots 010 \ldots 0$. When $M^i_0 = M^i_1 = \ldots = M^i_j = \ldots M^i_{N-1} = 0$, $R_i$ takes the logic value 0.

FIG. 6 and FIG. 8 show two different ways of implementations of the multiplexer used for read configuration in FIG. 4. For both implementations, the signal at $R_j$ will be propagated to the output $q_i$, when $M^0_i, M^1_i, \ldots M^{j-1}_i, M^j_i, M^{j+1}_i, \ldots, M^{k-1}_i = 00 \ldots 010 \ldots 0$. When $M^0_i = M^1_i = \ldots = M^{k-1}_i = 0$, the signal at $U_i$ will be propagated to the output $q_i$.

Having thus described presently preferred embodiments of the present invention, it can now be appreciated that the objectives of the invention have been fully achieved. And it will be understood by those skilled in the art that many changes in construction & circuitry, and widely differing embodiments & applications of the invention will suggest themselves without departing from the spirit and scope of the present invention. The disclosures and the description herein are intended to be illustrative and are not in any sense limitation of the invention, more preferably defined in the scope of the invention by the Claims appended hereto and their equivalents.

What the claimed is:

1. An apparatus for reconfiguring a set of N base blocks with k redundant blocks in a memory, up to k of N base blocks being likely to be defective, said apparatus comprising:
   a) using k N-to-1 multiplexer ($MUX_{Ri}$) to reconfigure a write function, wherein each said N-to-1 multiplexer $MUX_{Ri}$ has N input signals ($d_0$ to $d_{N-1}$) with the output of said N-to-1 multiplexer capable of being connected to the input signal of one of said k redundant blocks; and
   b) using N k+1-to-1 multiplexers ($MUX_i$) to reconfigure a read function, wherein each said k+1-to-1 multiplexer $MUX_i$ has k+1 input signals respectively connected from k redundant blocks and one base block input signal, $N_i$, with the output of each said k+1-to-1 multiplexer capable of being connected to an output signal ($q_i$).

2. The apparatus of claim 1, wherein said N input signals ($d_0$ to $d_{N-1}$) in said write function are connected to the N base blocks ($U_0$ to $U_{N-1}$) directly if the base blocks are defect-free.

3. The apparatus of claim 1, wherein the jth input signal $d_{j-1}$ of said N input signals ($d_0$ to $d_{N-1}$) in said write function is routed to the redundant block, $R_{i+1}$, if base block, $U_{j-1}$ ($0 \leq j \leq N-2$) is defective, the redundant block, $R_{i+1}$, ($0 \leq i \leq k-2$) is defect-free, and if there exists an integer $n<i+1$ such that the defect-free redundant block, $R_n$, is already assigned to a base unit $U_m$ with $m<j+1$, and the redundant blocks $R_{n+1}$, $R_{n+2}$, ..., $R_i$ are defective.

4. The apparatus of claim 2, wherein N output signals ($q_0$ to $q_{N-1}$) in said read function are connected to the N base blocks ($U_0$ to $U_{N-1}$) and the k redundant blocks ($R_0$ to $R_{k-1}$) via N k+1-to-1 multiplexers ($MUX_0$ to $MUX_{k-1}$).

5. The apparatus of claim 2, wherein a signal at $R_j$ will be propagated to the output $q_i$, when $M^0_i, M^1_i, \ldots, M^{j-1}_i, \ldots, M^j_i, M^{j+1}_i, \ldots, M^{k-1}_i = 00\ldots010\ldots0$. When $M^0_i = M^1_i = \ldots = M^j_i = \ldots = M^{k-1}_i = 0$, the signal at $U_i$ will be propagated to the output $q_i$.

\* \* \* \* \*